United States Patent [19]

Steele

[11] Patent Number: 5,144,582

[45] Date of Patent: Sep. 1, 1992

[54] SRAM BASED CELL FOR PROGRAMMABLE LOGIC DEVICES

[75] Inventor: Randy C. Steele, Southlake, Tex.

[73] Assignee: SGS-Thomson Microelectronics, Inc., Carrollton, Tex.

[21] Appl. No.: 502,572

[22] Filed: Mar. 30, 1990

[51] Int. Cl.$^5$ .............................................. G11C 13/00
[52] U.S. Cl. ................. 365/189.08; 307/465; 340/825.83
[58] Field of Search ............. 365/189.08; 364/716; 307/465, 468; 340/825.83

[56] References Cited

U.S. PATENT DOCUMENTS 4,710,898 12/1987 Sumi .............................. 365/189.88
4,789,951 12/1988 Birkner et al. ..................... 364/716
4,796,229 1/1989 Greer, Jr. et al. ............. 365/189.08

*Primary Examiner*—Joseph A. Popek
*Attorney, Agent, or Firm*—Kenneth C. Hill; Lisa K. Jorgenson; Richard K. Robinson

[57] ABSTRACT

A programmable cell for use in programmable logic devices utilizes CMOS SRAM technology. True and complement cells are paired, and generate a signal which can be combined with other such signals to give a product term. SRAM bits store program information, and drive the generated signal as a function of values at its true and complementary inputs. The generated signal goes through a full CMOS voltage swing, so that no sense amplifiers are required for the product term.

17 Claims, 3 Drawing Sheets

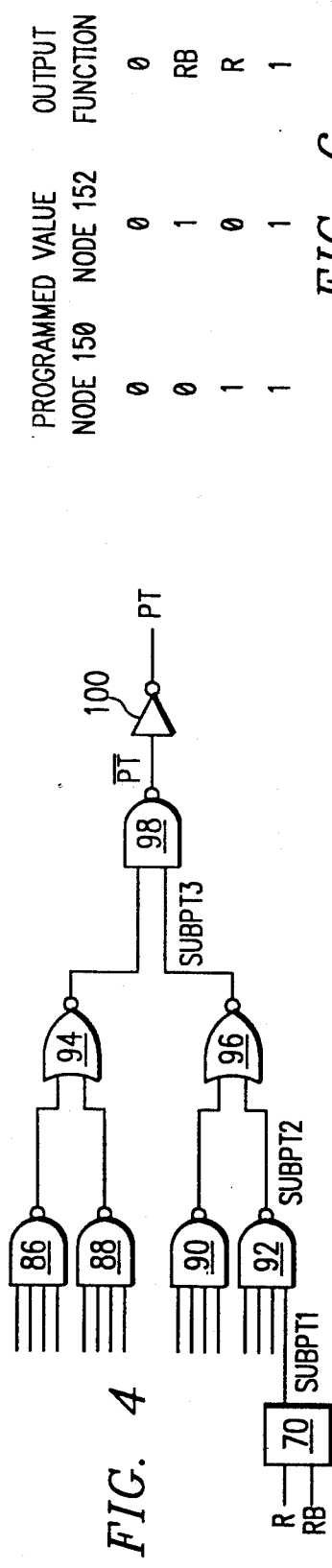
FIG. 4
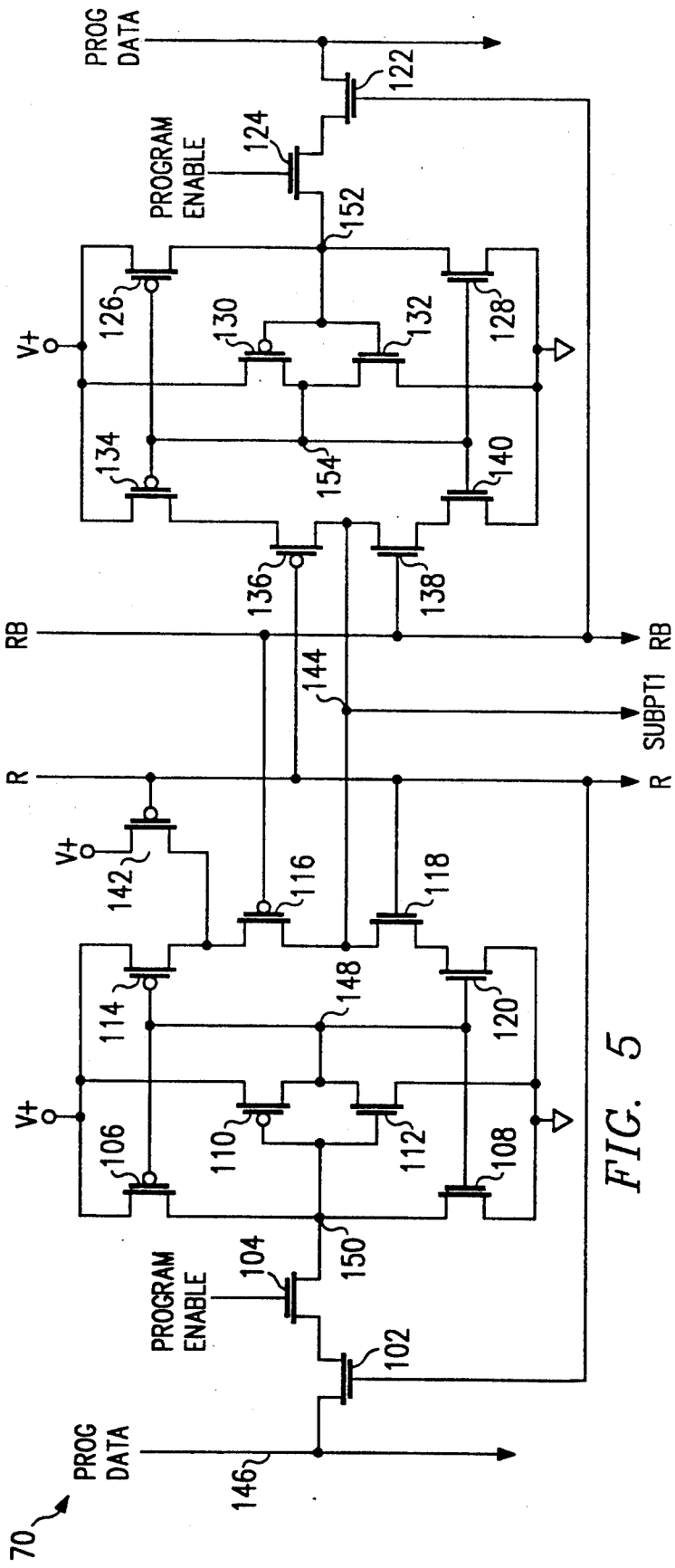
FIG. 5
FIG. 6
| PROGRAMMED VALUE | | OUTPUT FUNCTION |
|---|---|---|
| NODE 150 | NODE 152 | |
| 0 | 0 | 0 |
| 0 | 1 | RB |
| 1 | 0 | R |
| 1 | 1 | 1 |

SRAM BASED CELL FOR PROGRAMMABLE LOGIC DEVICES

CROSS-REFERENCE TO RELATED APPLICATIONS

The present application contains subject matter in common with copending U.S. application Ser. No. 414,712, titled CONFIGURATION MEMORY FOR PROGRAMMABLE LOGIC DEVICE, filed Sep. 9, 1989, and U.S. application Ser. No. 07/502,571, titled CONFIGURATION MEMORY FOR PROGRAMMABLE LOGIC DEVICE, filed on even date herewith, both of which are assigned to the assignee hereof and which are incorporated by reference hereinto.

BACKGROUND OF THE INVENTION

1. Field of the Invention

The present invention relates generally to semiconductor integrated circuits, and more specifically to programmable logic devices.

2. Description of the Prior Art

Programmable logic devices having and-or arrays are currently in wide use in the electronics industry. These devices provide sum-of-products logic functions. The sum-of-products functions are typically combined within output logic macrocells for performing additional logic functions.

The and-or array is programmed at a program time for the device. The programing defines selected logic functions which are to be performed by the device. Storage cells within the programmable logic device retain the programing information, so that the selected function is retained in the device. Typically, in MOS devices, nonvolatile memory elements such as EPROM or EEPROM cells are used to retain the programing information.

Use of EPROM and EEPROM elements for programing the programmable logic devices has several disadvantages. The programing time for the nonvolatile bits is relatively long, leading to long program times if a large number of complex devices must be programmed. Reprogramming an already programmed device is also a somewhat complex procedure. More complex integrated circuit processing is required to fabricate the EPROM or EEPROM devices than is otherwise required for the remaining elements of the device.

Presently available designs draw a fairly high current during operation and during quiescent conditions. This occurs in part because of the operating requirements of the EPROM or EEPROM cells. These designs use sense amplifiers to detect small voltage swings and amplify them to rail-to-rail voltage changes. The sense amps draw a fairly large amount of current whether or not they are being used.

It would be desirable to provide a cell suitable for use with and-or array programmable logic devices which is fast and which draws a small amount of current. It would further be desirable for such a device to be easily fabricated using available technology.

SUMMARY OF THE INVENTION

It is therefore an object of the present invention to provide a cell suitable for use in an and-or array of a programmable logic device.

It is another object of the present invention to provide such a cell which is fast in operation, and which draws extremely low levels of current.

It is another object of the present invention to provide such a cell which uses only standard CMOS SRAM technology for fabrication thereof.

Therefore, according to the present invention, a programmable cell for use in programmable logic devices utilizes CMOS SRAM technology. True and complement cells are paired, and generate a signal which can be combined with other such signals to give a product term. SRAM bits store program information, and drive the generated signal as a function of values at its true and complementary inputs. The generated signal goes through a full CMOS voltage swing, so that no sense amplifiers are required for the product term.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIG. 4 is a block diagram of an alternative logic circuit for generating product terms according to the present invention;

FIG. 5 is a schematic diagram of a cell for use with the block diagram of FIG. 4;

FIG. 6 is a logic table indicating output of the cell of FIG. 5 as a function of various inputs;

DESCRIPTION OF THE PREFERRED EMBODIMENT

Figure 1:
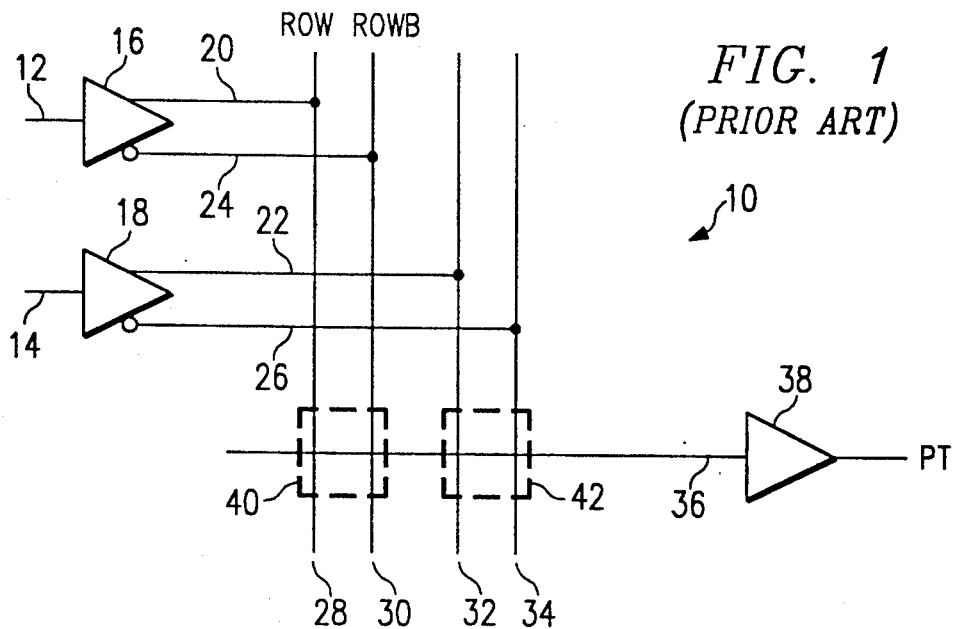
FIG. 1 is a schematic diagram of the AND array for a portion of a prior art logic device using an AND-OR array.

Referring to FIG. 1, a portion of an AND array of a prior art programmable logic device 10 is shown. Input signal lines 12, 14 carry input signals provided from off chip. Input signal lines 12, 14 are connected to input buffers 16, 18 respectively. Each input buffer 16, 18 provides a true signal line 20, 22 and a complement signal line 24, 26. Only two input signal lines 12, 14 and input buffers 16, 18 are shown in FIG. 1, but an actual device typically has a much larger number.

Each of the signal lines 20–26 is connected to a row line 28, 30, 32, 34. Row lines 28 and 30, designated with the signals ROW and ROWB, carry complementary signals determined by the input on line 12. Likewise, row lines 32, 34 contain complementary signals determined by the input on line 14. In addition to input signals, additional row lines can be used to carry feedback signals from output registers (not shown).

A product signal line 36 crosses all of the row lines 28–34, and drives a sense amplifier 38. Sense amplifier 38 generates output signal PT. Only one product signal line 36 is shown, but it is understood that many such lines are included in actual devices. A typical device might include, for example, 44 row lines and 132 product signal lines. As known in the art, several product terms are combined in an OR gate (not shown) to effect the OR function of the AND-OR array. The number of OR gates on a device used for combining product terms for the OR function is dependent on the device design, but many typical devices include 8-16 such OR combinations.

As known in the art, the signal available on line 36 is determined by programmed connections made between the row lines 28-34 and the product signal lines 36. Connections are made at the intersections of these lines by using transistor switches. In prior art field programmable logic devices, a typical transistor switch includes an EEPROM cell which is programmed ON or OFF in order for the connection at any particular point to be made or not made, respectively. EEPROM cells are typically built in pairs, with a single EEPROM cell pair 40, 42 having two switches and being programmed to determine the connections between one product signal line 36 and one row and its complement. In the example above, a device having 44 row lines (22 pairs) and 132 product signal lines would include 2904 EEPROM cell pairs (5808 bits) in the AND array.

Figure 2:
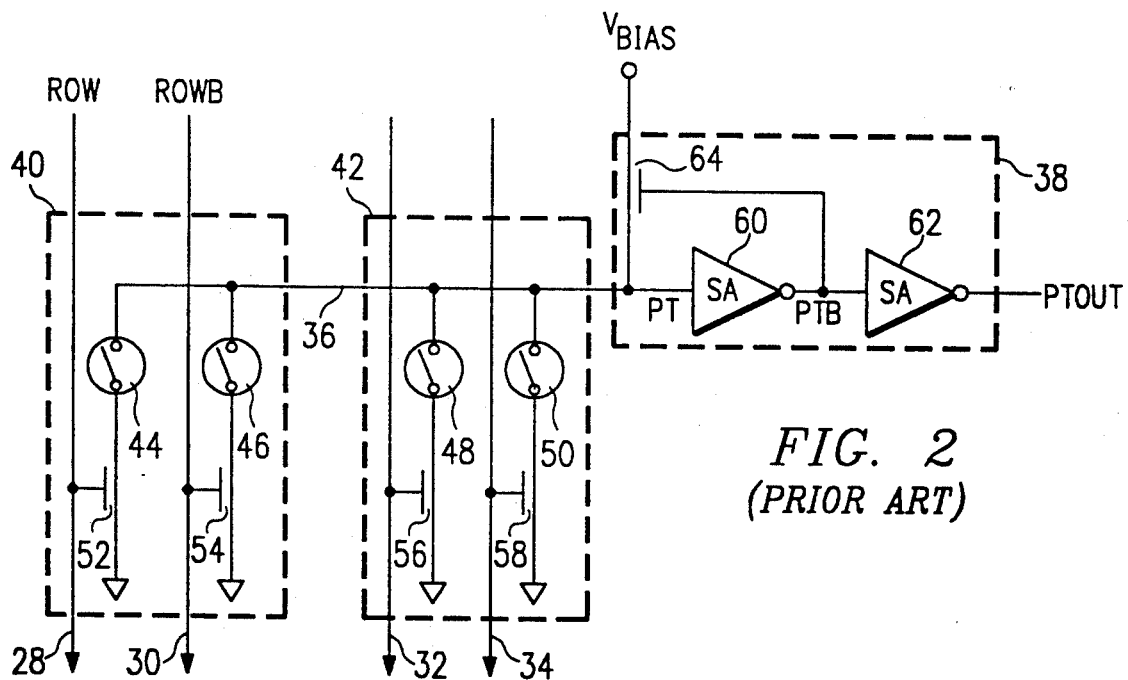
FIG. 2 is a schematic diagram of a prior art circuit for generating product terms.

FIG. 2 shows a typical prior art implementation of a portion of the array shown in FIG. 1. Cell pair 40 contains programmable switches 44, 46. Cell pair 42 contains programmable switches 48, 50. Programmable switch 44 connects signal line 36 to ground through select transistor 52. Switch 46 likewise connects signal line 36 to ground through select transistor 54. In a similar manner, programmable switches 48, 50 are used to connect line 36 to ground through select transistors 56, 58.

The combination of switches shown in FIG. 2 actually implements a wired NOR function. If any programmable switch and its corresponding select transistor are both on, the voltage at line 36 is pulled to ground. As known in the art, a NOR function can be used to implement an AND function by inverting the inputs. Thus, in the circuit of FIG. 2, the input signals ROW and ROWB are complemented before they are applied to the array. Thus, in FIG. 2, if ROW and ROWB are inverted in the buffer 16, the signal PT on line 36 is the logical AND of the true signal inputs applied to that row, for those rows which are programmed ON.

As known in the art, when EPROM or EEPROM cells are used for programmable switches 44-50, the amount of current which can pass through such switches is quite limited. Since the capacitance of signal line 36 is quite high, a long delay is encountered while signal line 36 discharges through one of the programmable switches. In order to improve the switching time of the cell pairs in the array, sense amplifier 38 is included. Sense amps 60, 62 sense small voltage swings on signal line 36, and amplify them to generate the signal PTOUT. Bias transistor 64 is used to pull the voltage of signal line 36 up to a proper bias level to ensure correct operation of sense amps 60, 62. Sense amplifier 38 takes up a significant amount of area on the integrated circuit, and consumes a substantial amount of supply current regardless of whether or not it is actually being used.

Figure 3:
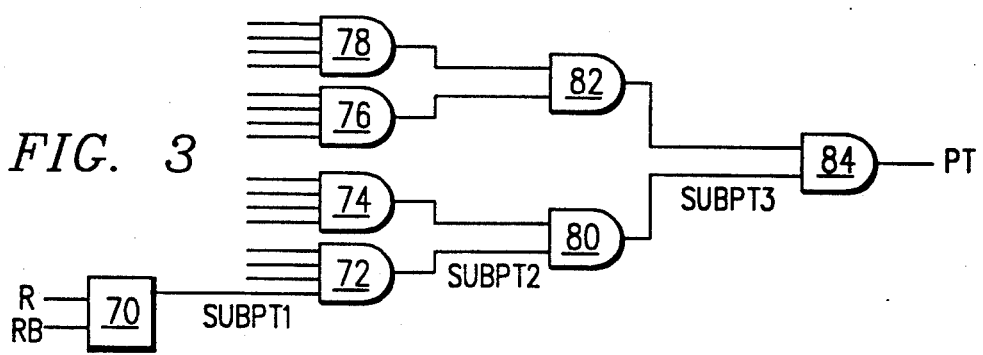
FIG. 3 is a block diagram of a logic circuit for generating product terms according to the present invention.

FIG. 3 shows a technique for generating the product term signal PT according to the present invention. A cell pair 70 has complementary inputs R and RB, and generates an output term SUBPT1. This signal is used as one input to a four input AND gate 72. Three other cell pairs (not shown) are identical to cell pair 70, and provide the remaining three inputs to AND gate 72. Twelve other identical cell pairs provide inputs to AND gates 74, 76, and 78.

Each of the AND gates 72, 74 generates an output signal SUBPT2, which are combined in AND gate 80. The outputs of gates 76 and 78 are likewise combined in AND gate 82. The SUBPT3 outputs of gates 80 and 82 are combined in AND gate 84. The output of gate 84 provides the product term signal PT.

The PT signal is therefore the logical AND of each of the sixteen inputs to the AND gates 72-78. If more than sixteen inputs are required for each product term, additional AND gates can be used in FIG. 3.

The arrangement of FIG. 3 has a number of important advantages over the design described in connection with FIG. 2. CMOS logic gates can be used for each of the AND gates 72-84, providing a full output voltage swing for the signal PT without requiring the use of a sense amplifier. Since only three logic levels are used, the time delay between the generation of the SUBPT1 signals by the cell pairs 70 and the appearance of a valid PT signal is quite short. The circuit of FIG. 3 requires that the cell pair 70 generate substantially a full CMOS output signal SUBPT1, and a preferred circuit for doing so is described in connection with FIG. 5.

FIG. 4 illustrates a circuit equivalent to the circuit of FIG. 3 using NAND and NOR gates. It will be apparent to those skilled in the art that the circuit of FIG. 4 truly is an equivalent circuit to that shown in FIG. 3, and the output of cell pair 70 has the same effect on both circuits. If any one of the cell pairs 70 have a SUBPT1 value of zero, the PT output is also a logical zero. Thus, logic gates 86-100 can be substituted for logic gates 72-84 in FIG. 3. As known in the art, NAND and NOR gates are more easily fabricated than AND gates. In most technologies, the circuit of FIG. 4 will be the preferable design.

FIG. 5 is a schematic diagram of a preferred cell pair 70. Transistors 102-120 provide a circuit for storing a programmed bit and generating an output signal responsive to a true row signal R. Transistors 122-140 provide the same function for the complement signal RB. Transistor 142 is used when cell pair programming is being verified.

Operation of the cell on the left hand side of FIG. 5 (transistors 102-120) will now be described. The cell on the right hand side of FIG. 5 (transistors 122-140) functions in an identical manner.

When the cell 70 is programmed, data is written into the cross-coupled latch consisting of transistors 106, 108, 110, and 112. Data is gated into the latch from signal line 146 through N-channel transistors 102, 104. Transistors 106, 108 are physically smaller than transistors 110 and 112, making transistors 106, 108 relatively weaker than transistors 110, 112. When the functions of transistors 102, 104 are considered as combined, these transistors plus transistors 106-112 form an asymmetrical 6-T SRAM memory cell. Transistors 106 and 108 are made weaker so that data may be reliably written into the SRAM cell through transistors 102, 104. This is necessary because a complementary signal is not made available at node 148.

To program the cells on the device, the device is placed into a programming mode. In this mode, all true and complement row lines R and RB are forced low. The data to be programmed into a cell is then presented on the PROG DATA line 146, and the row signal R is driven high, turning on transistor 102. The signal PROGRAM ENABLE is then driven high, turning on transistor 104. At this time, the value on signal line 146 is stored into signal node 150. The signal on node 148 will be driven to be the complement of the signal at 150. PROGRAM ENABLE is a global signal which is applied to the entire device.

If a low value is written onto node 150, transistor 110 turns on and forces node 148 to the positive supply. This turns on transistor 108, latching the voltage at node 150 to ground. If a high voltage is written onto node 150, transistor 112 turns on and latches the voltage at node 148 to ground. This turns on transistor 106, and latches the voltage at node 150 to the positive supply. Both sides of the cell pair are written into in a similar manner, and all of the cell pairs in the array are handled similarly during the programming stage. Since PROGRAM ENABLE allows one complete row to be written at a time, the length of time required to program the entire device is proportional to the number of rows.

Since transistors 106, 108 are relatively weak, trying to read the voltage stored at node 150 directly could cause the SRAM cell to change state. Therefore, an indirect technique is used to verify that the cell was programmed properly. To verify cell programming, the row signal R is driven high. If a zero voltage is stored on node 150, causing the voltage on node 148 to be high, the output voltage on node 144 is pulled to ground through transistors 118 and 120. In a similar manner, a high value stored on node 150 results in a high value on output node 144.

In order to read the values stored in each cell individually, all of the cell pairs 70 feeding into a given product term are forced to a logical one value, except for the cell being tested. This is done by driving both of the signals R and RB to a low value. This turns on both of transistors 116 and 136 as well as transistor 142. Since transistors 118 and 138 will be off, the voltage at node 144 is forced high. Transistor 142 is provided in order to ensure the voltage at node 144 is pulled high even if both of the transistors 114 and 134 are turned off as a result of the data programmed in their associated SRAM cells.

During normal operation of the device, the signals PROG DATA and PROGRAM ENABLE are grounded. This isolates nodes 150 and 152 and ensures that switching of transistors 102 and 122 has no effect. During normal operation, the signals R and RB will be complementary. The programmed values stored at nodes 150 and 152 will determine the output voltage on node 144 as a function of the inputs R and RB.

FIG. 6 is a table illustrating the output function provided at node 144 as a function of the programmed values stored onto nodes 150 and 152. If both nodes 150 and 152 have been programmed to a low value, transistors 120 and 140 will be on at all times. Transistors 114 and 134 will be off at all times. Since one of the transistors 118 or 138 must be on, the voltage at node 144 is pulled to ground, giving an output function of zero at all times as shown in the first line of the table of FIG. 6. If a high value is programmed into both nodes 150 and 152, transistors 120 and 140 will be off at all times, while transistors 114 and 134 will be on. Since R and RB are complementary, one of transistors 116 or 136 must be on, forcing the voltage at node 144 to a high value. Thus, as shown in the fourth line of the table of FIG. 6, the output function at node 144 is a logical one at all times.

When nodes 150 and 152 are programmed with different values, the output at node 144 will be a function of the values R and RB. If the values shown on line two of FIG. 6 are programmed into nodes 150 and 152, transistors 120 and 134 will be on at all times while transistors 114 and 140 will always be off. If the signal R is high, meaning RB is low, transistor 118 will turn on, driving the voltage at node 144 to ground. If RB is high, meaning R is low, transistor 136 will turn on and drive the voltage at node 144 to the positive supply. Thus, the output voltage at node 144 has the same value as the signal RB.

In a similar manner, programming a logical one (high voltage) into node 150 and a logical zero (low voltage) into node 152 causes the voltage at node 144 to be the same as the signal R. This happens because transistors 114 and 140 are always on, while transistors 120 and 134 are always off. When R is high, transistor 116 turns on and connects node 144 to the positive supply. When R is low, RB is high, turning on transistor 138, which connects node 144 to ground. Thus, the value of R is reflected in the output voltage at node 144.

When the output function is a logical one at all times, this cell pair provides a don't care condition to the product term. When the output function is zero at all times, the product term for this cell is forced to zero, which causes this product term to be a don't care term for the OR term. It will be recognized and appreciated by those skilled in the art that the cell function described in the table of FIG. 6 is precisely the function of standard JEDEC map bits for a cell pair. Thus, the cell pair 70 is programmed in a bit-compatible manner with the prior art cells shown in FIG. 2.

Figure 7:
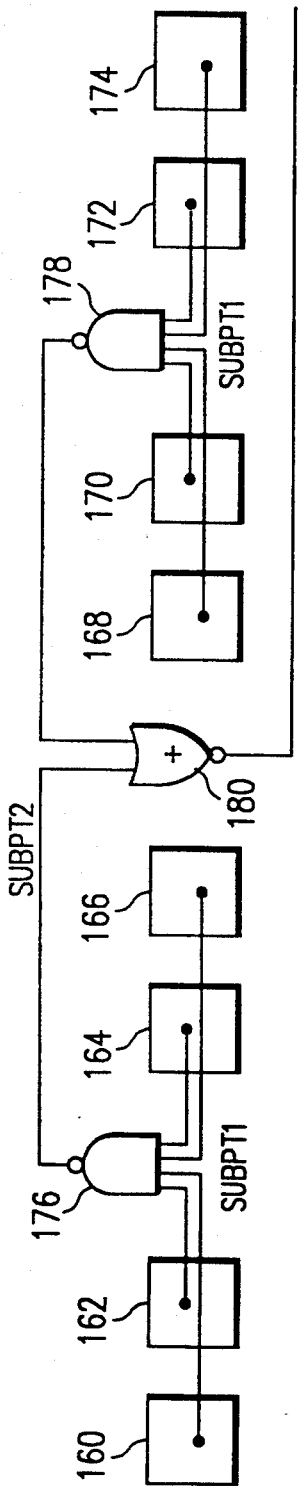
FIG. 7 is a layout diagram of a series of cells of FIG. 5 as they are used in an integrated circuit device.

FIG. 7 illustrates a preferred layout for a product term of cell pairs. In FIG. 7, eight cell pairs 160–174 are shown. The SUBPT1 output from cell pairs 160–166 are combined in NAND gate 176. The SUBPT1 output signals from cell pairs 168–174 are combined in NAND gate 178. The outputs of the two NAND gates 176, 178 are combined in NOR gate 180. The output of NOR gate 180 provides the signal SUBPT3 described in connection with FIGS. 3 and 4.

If a device provides eight true and complemented inputs per product term, the output of NOR gate 180 provides the PT signal. When sixteen inputs are provided as shown in FIGS. 3 and 4, a matching set of a eight cell pairs is used to provide another signal SUBPT3, with these being combined in a NAND gate as described in connection with FIG. 4. The remaining eight cell pairs (not shown) are placed to the right of FIG. 7, and in line therewith.

The layout shown in FIG. 7 provides a compact, regular layout for the array of a sum-of-products programmable logic device. The product term is made available at one end of the column of cell pairs as shown in FIG. 7. All of the ROW and ROWB signals pass vertically through the linear array of FIG. 7, providing easy access to all of the product terms. Although a fairly large number of transistors are required to form the SRAM cell pair described in connection with FIG. 5, sense amplifiers and their associated circuitry is not needed. Thus, the size of the sum-of-products array is only increased by a small amount, but the switching speed is increased by a significant amount. This increase in speed is obtained at the same time that a significant decrease in power requirements is obtained due to the elimination of sense amplifiers.

Various modifications can be made to the circuit shown in FIG. 5. If the signal PROGRAM ENABLE is made unique to each row, instead of being a global signal used by all rows as described above, the transistors 102 and 122 can be eliminated. In such case, it is not necessary to select the row for programming through the R and RB signals; such selection is accomplished by the PROGRAM ENABLE signal for the selected row. When such modification is made, the contents of the program bits are verified after programming in the same manner as described in connection with FIG. 5. During normal operation, all of the PROGRAM ENABLE signals must be connected to ground.

Figure 8:
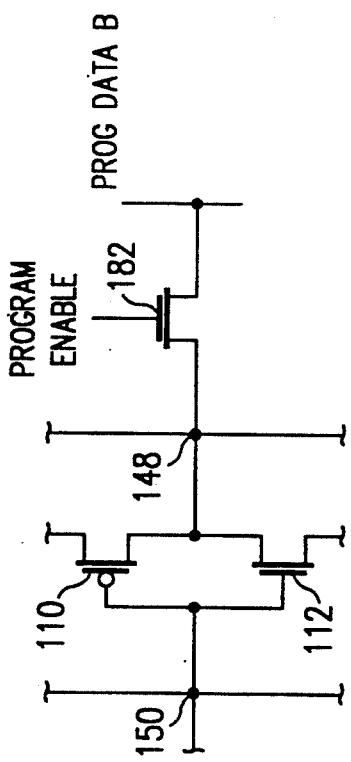
FIG. 8 is a schematic diagram of a modification to the circuit of FIG. 5.

Another modification which can be made to the circuit of FIG. 5 is shown in FIG. 8. In this alternative embodiment, a symmetrical 6-T SRAM cell is used to store the program bit. To form the 6-T cell, a transistor 182 is connected to node 148 as shown. This transistor 148 is driven by the same PROGRAM ENABLE signal that drives transistor 104. The signal PROG DATAB is complementary to the signal PROG DATA, and writes data into the SRAM cell formed by transistors 106-112 as known in the art. All of the transistors 106-112 are the same size, as is usual in symmetrical SRAM cells.

FIG. 8 is used when separate PROGRAM ENABLE signals are used for each row as described above. If transistor 102 is included instead, and a global PROGRAM ENABLE signal used, an additional transistor (not shown) must be added in series with transistor 182 and connected to the signal R. In either case, the cell connected to the RB signal is modified in a corresponding manner, so that the cell-pair is symmetrical.

Figure 9:
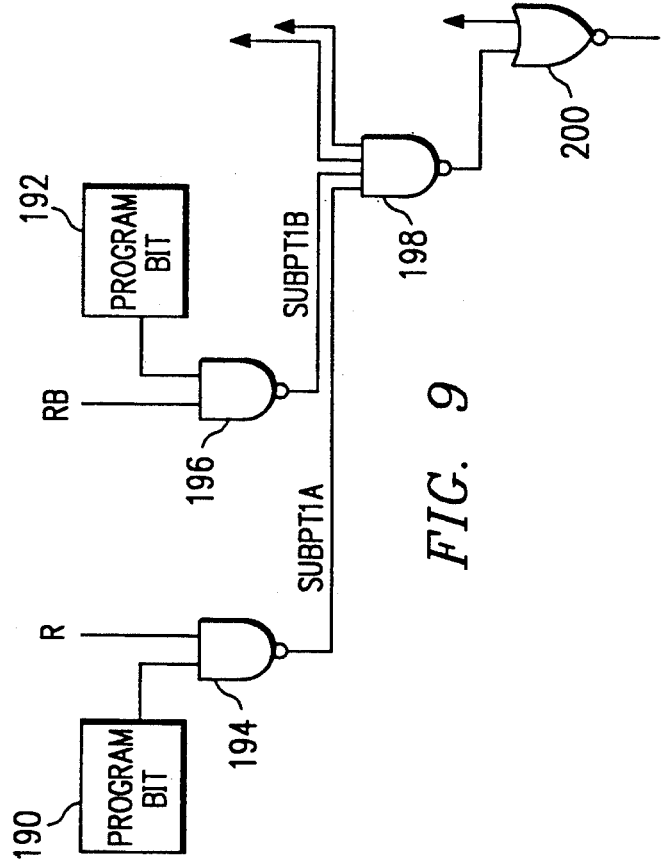
FIG. 9 is a block diagram illustrating additional features of the present invention.

FIG. 9 illustrates another alternative embodiment which is slightly simplified from that shown in FIG. 5. Blocks 190 and 192 represent SRAM cells for storage of the program bits. Any of the cells described above, as well as others, can be used. The outputs of blocks 190 and 192 are connected to NAND gates 194 and 196, respectively. The signals R and RB are also connected to gates 192 and 194 as shown. Gates 192 and 194 generate the signals SUBPT1A and SUBPT1B, which together correspond to the signal SUBPT1 of FIG. 5. SUBPT1A and SUBPT1B are connected to a NAND-NOR network represented by gates 198 and 200.

The NAND-NOR network is logically equivalent to the networks shown in FIGS. 3 and 4. Gates 194 and 196 correspond to the transistors 114-120 and 134-140 in FIG. 5. Use of NAND gates 194 and 196 can result in faster operation than the circuit of FIG. 5 due to decreased parasitic capacitances. The circuits operate using the same principles, both being based on the use of CMOS logic gates to perform the AND function of the array and storage of the program information in SRAM cells. The embodiment of FIG. 9 is programmed using the same JEDEC map as described above.

The cell pair 70 described in connection with FIG. 5, and the modifications shown in FIGS. 8 and 9, are fully CMOS circuits, so that a full voltage swing is provided for the output signals. As described above in connection with FIGS. 3 and 4, such a full output swing is required for proper operation of the logic gates used to generate the product term. Since such a full voltage swing is provided, no sense amplifiers are needed. In addition, no current is drawn by the cell pair 70 except during switching. Since only a small number of gate delays are required between switching the signals R and RB, and generation of the product term output signal PT, the device is significantly faster, for a given power requirement, than prior art devices which use sense amplifiers. Thus, the described device provides a greatly enhanced speed/power product.

The SRAM based programmable logic device described above has a number of important advantages over prior art designs. Standby current for the device is very low, being typically on the order of approximately 100 microamps. Switching current is also very low. The circuit operates fast because full logic levels are used. Since the program bits are written into an SRAM, the device can be programmed much faster than prior art devices. Programming time can be on the order of a few hundreds of nanoseconds per row, versus several milliseconds per row for EPROM or EEPROM devices. No bulk erase of the array is required before reprogramming, as is the case with EPROM and EEPROM devices.

This speed increase, based on a radically different cell design than provided in the prior art, is achieved without any loss of bit-wise programing compatibility with prior art devices. Thus, a programmable logic device constructed as described above is a completely compatible replacement for the prior art devices.

Since the programming bits for the device described herein are stored in SRAM, programming information will be lost if power to the device is removed. If this is not a problem, the device can be reprogrammed each time the system is powered up. Alternatively, power fail detection circuitry such as known in the art can be incorporated with the device, and a backup battery can be supplied. When power to the device fails, the backup battery is automatically connected to the power terminals and continues to provide power to the device. In this manner, the programming information will be retained even through a power failure. Since the device is fully CMOS, and the standby power drain is very low, the battery backup device can retain its program for a minimum of several years. A description of suitable power fail detection circuitry is described in copending U.S. application Ser. No. 414,712, titled CONFIGURATION MEMORY FOR PROGRAMMABLE LOGIC DEVICE, filed Sep. 9, 1989, and assigned to the assignee hereof.

While the invention has been particularly shown and described with reference to a preferred embodiment, it will be understood by those skilled in the art that various changes in form and detail may be made therein without departing from the spirit and scope of the invention.

What is claimed is:

1. A programmable logic device having a plurality of inputs and a plurality of outputs connected to an AND-OR array for defining logic functions to be performed by the device, comprising:

a plurality of SRAM cells arranged in a regular matrix for storing program information defining connections in the AND-OR array; and logic gates connecting outputs from selected SRAM cells together to perform logic functions thereon, said logic gates generating outputs which define product terms of the AND-OR array.

2. The device of claim 1, wherein said SRAM cells comprise asymmetrical 5 transistor cells.

3. The device of claim 1, wherein said SRAM cells comprise symmetrical 6 transistor cells.

4. The device of claim 1, wherein said SRAM cells comprise asymmetrical 6 transistor cells, wherein each SRAM cell is programmed using a global program enable signal and a signal supplied to a row signal line corresponding to the cell.

5. The device of claim 1, wherein one of said logic gates combines the output of each SRAM cell with a selected row or complemented row signal.

6. The device of claim 5, wherein each SRAM cell in the matrix has an output connected to a NAND gate, wherein a second input for each NAND gate is connected to a selected row or complementary row signal, and wherein an output of each NAND gate is connected to an input of one of said logic gates.

7. The device of claim 1, wherein said SRAM cells are connected together into pairs of cells having complementary row inputs, wherein the outputs of the cells in each pair are combined into a single signal.

8. The device of claim 7, wherein the single signal outputs of selected cell pairs are combined in said logic gates to generate product term signals.

9. An AND-OR array for a semiconductor integrated circuit programmable logic device, comprising:
   a plurality of linear arrays of SRAM cells, each linear array corresponding to a product term of the AND-OR array;
   wherein each SRAM cell contains a programming bit defining a connection in the AND-OR array;
   a plurality of first logic gates, each of said logic gates connected to at least two of the SRAM cells in a single linear array; and
   at least one additional logic gate having inputs connected to outputs of selected first logic gates or to outputs of selected additional logic gates, wherein said additional logic gates combine signals from the SRAM cells so as to generate an output signal which is defined as a product term for each of said linear arrays.

10. The AND-OR array of claim 9, wherein the SRAM cells are grouped into pairs of cells having a common output node, and wherein the common output nodes connect to the inputs of said first logic gates.

11. The AND-OR array of claim 10, wherein the SRAM cells comprise symmetrical 6 transistor cells.

12. The AND-OR array of claim 10, wherein said SRAM cells comprise asymmetrical 6 transistor cells, wherein each SRAM cell is programmed using a global program enable signal and a signal supplied to a row signal line corresponding to the cell.

13. A method for generating product term signals in a semiconductor integrated circuit programmable logic device, comprising the steps of:
   storing data in an array of SRAM cells;
   providing input signals to the array;
   generating output signals from the SRAM cells which are a function of input signals applied thereto and the data stored in the cells; and
   combining selected groups of SRAM cell outputs in logic gates to form product term signals.

14. The method of claim 13, wherein the selected groups of SRAM cell outputs selected to form each product term are obtained from SRAM cells located in a single row of the array.

15. The method of claim 14 wherein, within a row of SRAM cells located in a single row of the array, SRAM cells having row and complementary row inputs are paired so as to provide a common output signal, and wherein such common output signals are combined to form the product term signals.

16. The method of claim 13, wherein an SRAM bit in each cell is logically combined with a row or complementary row signal to generate the output signal from the cell.

17. The method of claim 16, wherein the SRAM bit is combined with the row or complementary row signal in a NAND gate.

* * * * *